United States Patent
McCallion et al.

(10) Patent No.: US 7,480,464 B2
(45) Date of Patent: Jan. 20, 2009

(54) WIDELY TUNABLE, DISPERSION TOLERANT TRANSMITTER

(75) Inventors: Kevin McCallion, Charlestown, MA (US); Yasuhiro Matsui, Lawrence, MA (US); Jianying Zhou, Acton, MA (US); Michael Deutsch, Derry, NH (US); Parviz Tayebati, Boston, MA (US); Daniel Mahgerefteh, Somerville, MA (US)

(73) Assignee: Finisar Corporation, Sunnyvale, CA (US)

( * ) Notice: Subject to any disclaimer, the term of this patent is extended or adjusted under 35 U.S.C. 154(b) by 184 days.

(21) Appl. No.: 11/635,861

(22) Filed: Dec. 8, 2006

(65) Prior Publication Data
US 2007/0183792 A1     Aug. 9, 2007

Related U.S. Application Data

(63) Continuation-in-part of application No. 11/272,100, filed on Nov. 8, 2005, and a continuation-in-part of application No. 10/308,522, filed on Dec. 3, 2002, and a continuation-in-part of application No. 11/441,944, filed on May 26, 2006, and a continuation-in-part of application No. 10/933,081, filed on Sep. 2, 2004, now Pat. No. 7,406,267, and a continuation-in-part of application No. 11/068,032, filed on Feb. 28, 2005, and a continuation-in-part of application No. 11/084,633, filed on Mar. 18, 2005, and a continuation-in-part of application No. 11/084,630, filed on Mar. 18, 2005, now Pat. No. 7,406,266.

(60) Provisional application No. 60/748,466, filed on Dec. 8, 2005.

(51) Int. Cl.
  *H04J 14/02*     (2006.01)
  *H04B 10/04*     (2006.01)
(52) U.S. Cl. ......................................... 398/201; 398/91
(58) Field of Classification Search .................. 398/91, 398/201
  See application file for complete search history.

(56) References Cited

U.S. PATENT DOCUMENTS 3,324,295 A     6/1967  Harris
3,999,105 A    12/1976  Archey et al.

(Continued)

FOREIGN PATENT DOCUMENTS

GB     2 107 147       4/1983

(Continued)

OTHER PUBLICATIONS

Alexander et al., Passive Equalization of Semiconductor Diode Laser Frequency Modulation, Journal of Lightwave Technology, Jan. 1989, 11-23, vol. 7, No. 1.

(Continued)

*Primary Examiner*—Leslie Pascal
(74) *Attorney, Agent, or Firm*—Workman Nydegger

(57) ABSTRACT

An optical transmitter comprising:
  (i) an electrical switch;
  (ii) a laser array comprising a plurality of tunable laser elements; and
  (iii) an Optical Spectrum Reshaper (OSR) used to reshape the output pulses from the laser elements in the laser array;

wherein the electrical switch takes an input electrical digital signal and selectively directs it to a specific laser element in the DFB laser array.

6 Claims, 2 Drawing Sheets

U.S. PATENT DOCUMENTS

| | | | |
|---|---|---|---|
| 4,038,600 | A | 7/1977 | Thomas et al. |
| 4,561,119 | A | 12/1985 | Epworth |
| 4,805,235 | A | 2/1989 | Henmi |
| 4,841,519 | A | 6/1989 | Nishio |
| 5,177,630 | A * | 1/1993 | Goutzoulis et al. ............ 398/98 |
| 5,293,545 | A | 3/1994 | Huber |
| 5,325,378 | A | 6/1994 | Zorabedian |
| 5,371,625 | A | 12/1994 | Wedding et al. |
| 5,412,474 | A | 5/1995 | Reasenberg et al. |
| 5,416,629 | A | 5/1995 | Huber |
| 5,465,264 | A | 11/1995 | Buhler et al. |
| 5,477,368 | A | 12/1995 | Eskildsen et al. |
| 5,550,667 | A | 8/1996 | Krimmel et al. |
| 5,737,104 | A | 4/1998 | Lee et al. |
| 5,777,773 | A | 7/1998 | Epworth et al. |
| 5,805,235 | A | 9/1998 | Bedard |
| 5,856,980 | A | 1/1999 | Doyle et al. |
| 5,920,416 | A | 7/1999 | Beylat et al. |
| 5,953,139 | A | 9/1999 | Nemecek et al. |
| 5,974,209 | A | 10/1999 | Cho et al. |
| 6,081,361 | A | 6/2000 | Adams et al. |
| 6,096,496 | A | 8/2000 | Frankel |
| 6,104,851 | A | 8/2000 | Mahgerefteh |
| 6,115,403 | A | 9/2000 | Brenner et al. |
| 6,222,861 | B1 | 4/2001 | Kuo et al. |
| 6,271,959 | B1 | 8/2001 | Kim et al. |
| 6,298,186 | B1 | 10/2001 | He |
| 6,331,991 | B1 | 12/2001 | Mahgerefteh |
| 6,359,716 | B1 | 3/2002 | Taylor |
| 6,473,214 | B1 | 10/2002 | Roberts et al. |
| 6,506,342 | B1 | 1/2003 | Frankel |
| 6,577,013 | B1 | 6/2003 | Glenn et al. |
| 6,618,513 | B2 | 9/2003 | Evankow, Jr. |
| 6,654,564 | B1 | 11/2003 | Colbourne et al. |
| 6,665,351 | B2 | 12/2003 | Hedberg et al. |
| 6,748,133 | B2 | 6/2004 | Liu et al. |
| 6,778,307 | B2 | 8/2004 | Clark |
| 6,810,047 | B2 | 10/2004 | Oh et al. |
| 6,836,487 | B1 | 12/2004 | Farmer et al. |
| 6,847,758 | B1 | 1/2005 | Watanabe |
| 6,947,206 | B2 | 9/2005 | Tsadka et al. |
| 6,963,685 | B2 | 11/2005 | Mahgerefteh et al. |
| 7,013,090 | B2 | 3/2006 | Adachi et al. |
| 7,054,538 | B2 | 5/2006 | Mahgerefteh et al. |
| 7,076,170 | B2 | 7/2006 | Choa |
| 7,123,846 | B2 | 10/2006 | Tateyama et al. |
| 7,263,291 | B2 | 8/2007 | Mahgerefteh et al. |
| 7,280,721 | B2 | 10/2007 | McCallion et al. |
| 2002/0154372 | A1 | 10/2002 | Chung et al. |
| 2002/0159490 | A1 | 10/2002 | Karwacki |
| 2002/0176659 | A1 | 11/2002 | Lei et al. |
| 2003/0002120 | A1 | 1/2003 | Choa |
| 2003/0067952 | A1 | 4/2003 | Tsukiji et al. |
| 2003/0099018 | A1 | 5/2003 | Singh et al. |
| 2003/0147114 | A1 | 8/2003 | Kang et al. |
| 2003/0193974 | A1 | 10/2003 | Frankel et al. |
| 2004/0008933 | A1 | 1/2004 | Mahgerefteh et al. |
| 2004/0008937 | A1 | 1/2004 | Mahgerefteh et al. |
| 2004/0036943 | A1 | 2/2004 | Freund et al. |
| 2004/0096221 | A1 | 5/2004 | Mahgerefteh et al. |
| 2004/0218890 | A1 | 11/2004 | Mahgerefteh et al. |
| 2005/0100345 | A1 | 5/2005 | Welch et al. |
| 2005/0111852 | A1 | 5/2005 | Mahgerefteh et al. |
| 2005/0175356 | A1 | 8/2005 | McCallion et al. |
| 2005/0206989 | A1 | 9/2005 | Marsh |
| 2005/0271394 | A1 | 12/2005 | Whiteaway et al. |
| 2005/0286829 | A1 | 12/2005 | Mahgerefteh et al. |
| 2006/0002718 | A1 | 1/2006 | Matsui et al. |
| 2006/0018666 | A1 | 1/2006 | Matsui et al. |
| 2006/0029358 | A1 | 2/2006 | Mahgerefteh et al. |
| 2006/0029396 | A1 | 2/2006 | Mahgerefteh et al. |
| 2006/0029397 | A1 | 2/2006 | Mahgerefteh et al. |
| 2006/0228120 | A9 | 10/2006 | McCallion et al. |
| 2006/0233556 | A1 | 10/2006 | Mahgerefteh et al. |
| 2006/0274993 | A1 | 12/2006 | Mahgerefteh et al. |

FOREIGN PATENT DOCUMENTS

| | | |
|---|---|---|
| WO | 9905804 | 2/1999 |
| WO | 0104999 | 1/2001 |
| WO | 03005512 | 7/2002 |

OTHER PUBLICATIONS

Binder, J. et al., 10 Gbit/s-Dispersion Optimized Transmission at 1.55 um Wavelength on Standard Single Mode Fiber, IEEE Photonics Technology Letters, Apr. 1994, 558-560, vol. 6, No. 4.

Corvini, P.J. et al., Computer Simulation of High-Bit-Rate Optical Fiber Transmission Using Single-Frequency Lasers, Journal of Lightwave Technology, Nov. 1987, 1591-1596, vol. LT-5, No. 11.

Hyryniewicz, J.V., et al., Higher Order Filter Response in Coupled MicroRing Resonators, IEEE Photonics Technology Letters, Mar. 2000, 320-322, vol. 12, No. 3.

Koch, T. L. et al., Nature of Wavelength Chirping in Directly Modulated Semiconductor Lasers, Electroncis Letters, Dec. 6, 1984, 1038-1039, vol. 20, No. 25/26.

Kurtzke, C., et al., Impact of Residual Amplitude Modulation on the Performance of Dispersion-Supported and Dispersion-Mediated Nonlinearity-Enhanced Transmission, Electronics Letters, Jun. 9,1994, 988, vol. 30, No. 12.

Lee, Chang-Hee et al., Transmission of Directly Modulated 2.5-Gb/s Signals Over 250-km of Nondispersion-Shifted Fiber by Using a Spectral Filtering Method, IEEE Photonics Technology Letters, Dec. 1996, 1725-1727, vol. 8, No. 12.

Li, Yuan P., et al., Chapter 8: Silicon Optical Bench Waveguide Technology, Optical Fiber Communications, 1997, 319-370, vol. 111B, Lucent Technologies, New York.

Little, Brent E., Advances in MicroRing Resonators, Integrated Photonics Research Conference 2003.

Mohrdiek, S. et al., 10-Gb/s Standard Fiber Transmission Using Directly Modulated 1.55-um Quantum-Well DFB Lasers, IEEE Photonics Technology Letters, Nov. 1995, 1357-1359, vol. 7, No. 11.

Morton, P.A. et al., "38.5km error free transmission at 10Gbit/s in standard fibre using a low chirp, spectrally filtered, directly modulated 1.55um DFB laser", Electronics Letters, Feb. 13, 1997, vol. 33(4).

Prokais, John G., Digital Communications, 2001, 202-207, Fourth Edition, McGraw Hill, New York.

Rasmussen, C.J., et al., Optimum Amplitude and Frequency-Modulation in an Optical Communication System Based on Dispersion Supported Transmission, Electronics Letters, Apr. 27, 1995, 746, vol. 31, No. 9.

Shalom, Hamutal et al., On the Various Time Constants of Wavelength Changes of a DFB Laser Under Direct Modulation, IEEE Journal of Quantum Electronics, Oct. 1998, pp. 1816-1822, vol. 34, No. 10.

Wedding, B., Analysis of fibre transfer function and determination of receiver frequency response for dispersion supported transmission, Electronics Letters, Jan. 6, 1994, 58-59, vol. 30, No. 1.

Wedding, B., et al., 10-Gb/s Optical Transmission up to 253 km Via Standard Single-Mode Fiber Using the Method of Dispersion-Supported Transmission, Journal of Lightwave Technology, Oct. 1994, 1720, vol. 12, No. 10.

Yu, et al., Optimization of the Frequency Response of Semiconductor Optical Amplifier Wavelength Converter Using a Fiber Bragg Grating, Journal of Lightwave Technology, Feb. 1999, 308-315, vol. 17, No. 2.

* cited by examiner

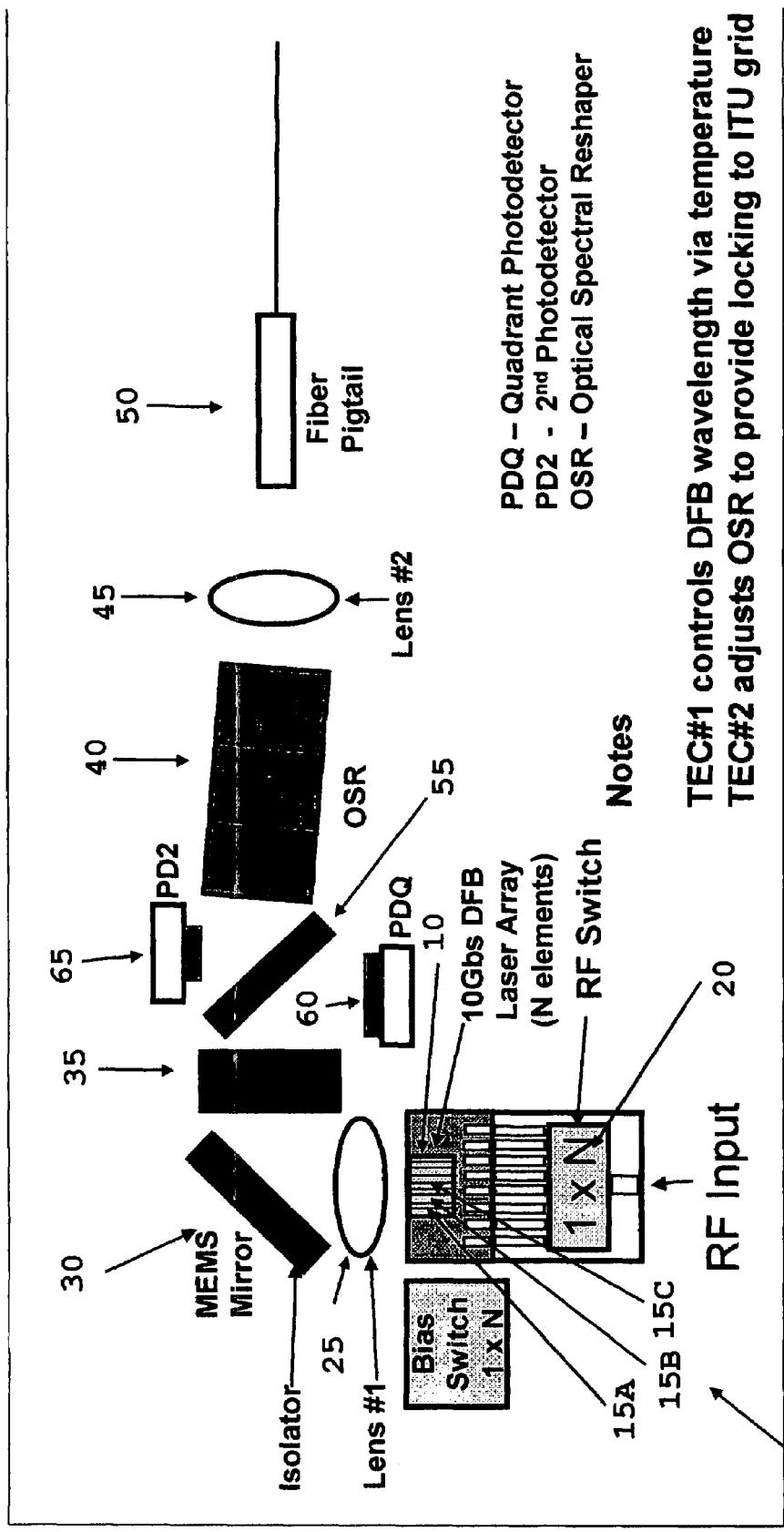
Figure 1: Widely Tunable CML Transmitter

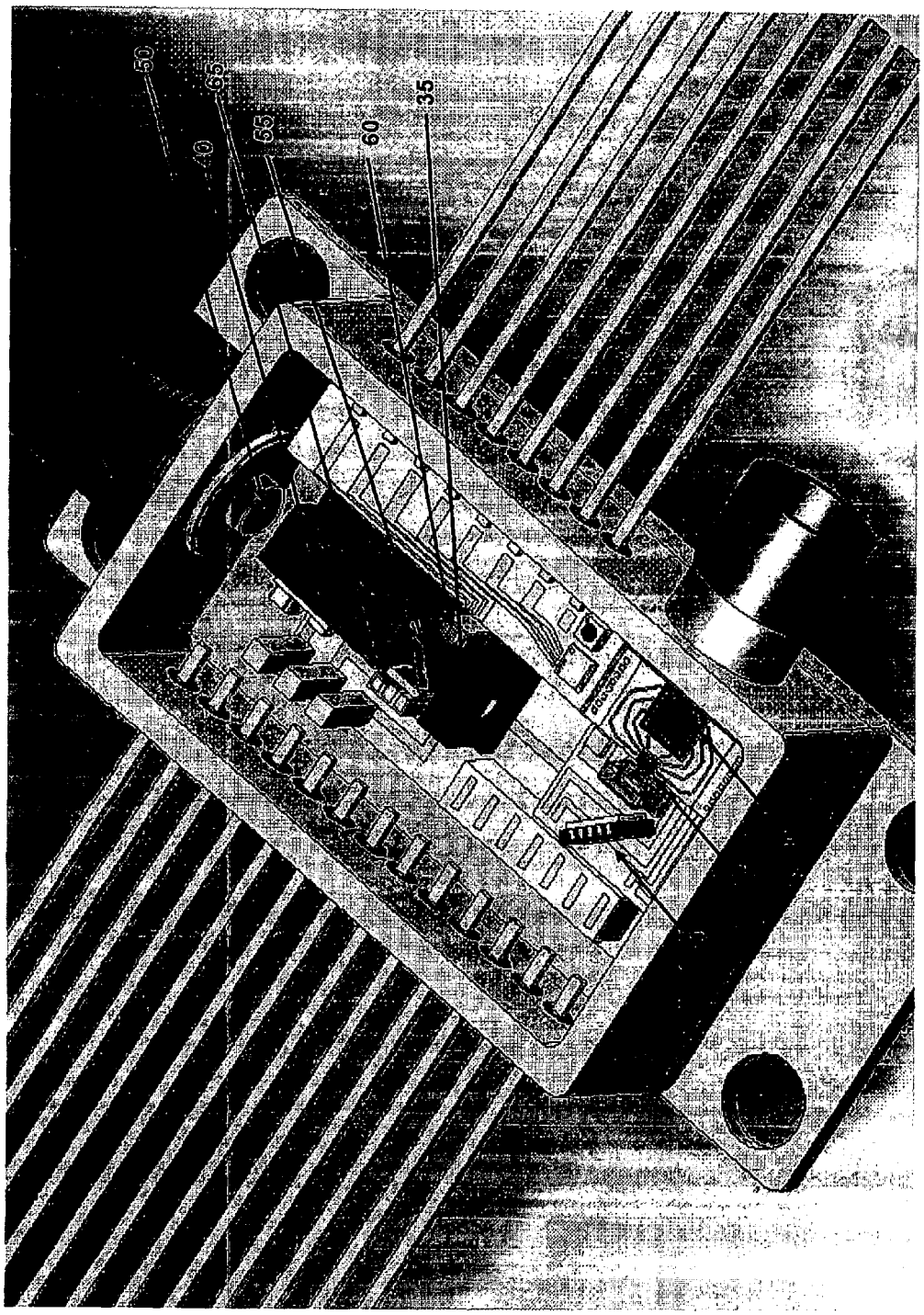
Figure 2 shows an example of a package used to contain the above assembly of components.

WIDELY TUNABLE, DISPERSION TOLERANT TRANSMITTER

REFERENCE TO PENDING PRIOR PATENT APPLICATIONS

This patent application:

(i) is a continuation-in-part of pending prior U.S. patent application Ser. No. 11/272,100, filed Nov. 8, 2005 by Daniel Mahgerefteh et al. for POWER SOURCE FOR A DISPERSION COMPENSATION FIBER OPTIC SYSTEM;

(ii) is a continuation-in-part of pending prior U.S. patent application Ser. No. 10/308,522, filed Dec. 3, 2002 by Daniel Mahgerefteh et al. for HIGH-SPEED TRANSMISSION SYSTEM COMPRISING A COUPLED MULTI-CAVITY OPTICAL DISCRIMINATOR;

(iii) is a continuation-in-part of pending prior U.S. patent application Ser. No. 11/441,944, filed May 26, 2006 by Daniel Mahgerefteh et al. for FLAT DISPERSION FREQUENCY DISCRIMINATOR (FDFD);

(iv) is a continuation-in-part of pending prior U.S. patent application Ser. No. 10/933,081, filed Sep. 2, 2004 now U.S. Pat. No. 7,406,267 by Daniel Mahgerefteh et al. for METHOD AND APPARATUS FOR TRANSMITTING A SIGNAL USING THERMAL CHIRP MANAGEMENT OF A DIRECTLY MODULATED TRANSMITTER;

(v) is a continuation-in-part of prior U.S. patent application Ser. No. 11/068,032, filed Feb. 28, 2005 by Daniel Mahgerefteh et al. for OPTICAL SYSTEM COMPRISING AN FM SOURCE AND A SPECTRAL RESHAPING ELEMENT;

(vi) is a continuation-in-part of pending prior U.S. patent application Ser. No. 11/084,633, filed Mar. 18, 2005 by Daniel Mahgerefteh et al. for METHOD AND APPARATUS FOR TRANSMITTING A SIGNAL USING SIMULTANEOUS FM AND AM MODULATION;

(vii) is a continuation-in-part of pending prior U.S. patent application Ser. No. 11/084,630, filed Mar. 18, 2005 now U.S. Pat. No. 7,406,266 by Daniel Mahgerefteh et al. for FLAT-TOPPED CHIRP INDUCED BY OPTICAL FILTER EDGE; and (viii) claims benefit of pending prior U.S. Provisional Patent Application Ser. No. 60/748,466, filed Dec. 8, 2005 by Kevin McCallion et al. for WIDELY TUNABLE DISPERSION TOLERANT TRANSMITTER.

The eight (8) above-identified patent applications are hereby incorporated herein by reference.

FIELD OF THE INVENTION

This invention relates to signal transmissions in general, and more particularly to the transmission of optical signals and electrical signals.

BACKGROUND OF THE INVENTION

The quality and performance of a digital transmitter is determined by the distance over which the transmitted digital signal can propagate without severe distortions. This is typically characterized as the distance over which a dispersion penalty reaches a level of ~1 dB. A standard 10 Gb/s optical digital transmitter, such as an externally modulated optical source (e.g., a laser), can transmit up to a distance of ~50 km in standard single mode fiber, at 1550 nm, before the dispersion penalty reaches the level of ~1 dB. This distance is typically called the dispersion limit. The dispersion limit is determined by the fundamental assumption that the digital signal is transform-limited, i.e., the signal has no time-varying phase across its bits and the signal has a bit period of 100 ps, or 1/(bit rate) for a 10 Gb/s optical digital transmitter.

Three types of optical transmitters are currently in use in prior art fiber optic transmission systems:

(i) Directly Modulated Laser (DML) transmitters;

(ii) Electroabsorption Modulated Laser (EML) transmitters; and (iii) externally modulated Mach Zhender (MZ) transmitters.

For transmissions in standard single mode fiber, at 10 Gb/s and 1550 nm, it has generally been assumed that MZ and EML transmitters can achieve the longest reach, typically reaching 80 km. Using a special coding scheme, generally referred to as phase shaped duobinary transmission, MZ transmitters can reach 200 km. On the other hand, DML transmitters generally reach <5 km because their inherent time dependent chirp causes severe distortion of the signal after this <5 km distance.

Azna LLC of Wilmington, Massachusetts has recently developed a novel line of CML transmitters which can exceed the aforementioned <5 km transmission limit of conventional DML transmitters. By way of example but not limitation, various novel DML systems for long-reach optical data transmission (e.g., >80 km at 10 Gb/s) through optical fibers in single mode fiber are disclosed in the eight (8) above-identified U.S. patent applications (which patent applications are hereby incorporated herein by reference). The CML transmitter associated with these novel systems is sometimes referred to by Azna LLC as a Chirp Managed Laser (CML)™. In these new CML systems, a Frequency Modulated (FM) source (e.g., a laser) and an optical spectrum reshaper (e.g., a filter) which uses the frequency modulation to increase the amplitude modulated signal and compensate for dispersion in the transmission fiber. In one novel CML embodiment, the frequency modulated source may comprise a Directly Modulated Laser (DML). The Optical Spectrum Reshaper (OSR), sometimes referred to as a frequency discriminator, can be formed by an appropriate optical element that has a wavelength-dependent transmission function (e.g., a filter). The OSR can be adapted to convert frequency modulation to amplitude modulation.

A wavelength tunable laser source is of great interest in Wavelength Division Multiplexing (WDM) systems in which a number of different laser wavelengths are used to simultaneously transmit multiple channels of digital information through an optical fiber. This is because a single wavelength tunable laser can be used to generate the light signal needed for any one of the different channels, thereby greatly simplifying equipment maintenance and inventory considerations.

In the prior art, tunable lasers are typically externally modulated devices which use lithium niobate or InP Mach Zehnder modulators. The signals generated by these externally modulated optical transmitters require a relatively high drive voltage. In addition, the dispersion distance of these external modulators can be limited: for example, these external modulators typically have a dispersion limit of <80 km, at 10 Gbps at 1550 nm, in standard Single Mode Fiber (SMF).

SUMMARY OF THE INVENTION

In the present invention, a tunable laser is directly modulated so as to generate a frequency modulated signal which is then passed through an OSR so as to generate an amplitude modulated signal which has high tolerance to dispersion, for example, >250 km, at 10 Gbps at 1550 nm, in SMF. This novel transmitter is sometimes referred to herein as a tunable Chirp Managed Laser (CML). The tunable CML of the present invention can be tuned, for example, to any desired wavelength channel within the C band (typically 1528-1565 nm) or L band (1565-1620 nm), whereby to provide high speed, long reach (i.e., dispersion tolerant) optical transmission not achievable with prior art devices.

In one form of the present invention, there is provided a novel optical transmitter which comprises (i) a high-speed electrical switch; (ii) a laser array comprising a plurality of thermally tunable, directly modulated high-speed Distributed Feedback (DFB) laser elements; and (iii) a periodic Optical Spectrum Reshaper (OSR) (e.g., a filter) that is used to reshape the output pulses from the DFB laser elements in the laser array. The high speed switch takes an input electrical digital signal and selectively directs it to a specific laser element in the DFB laser array.

The optical outputs of the individual laser elements in the laser array can each be selectively coupled to the OSR filter (i.e., directed into the OSR filter) by various means of the sort well known in the art (e.g., mirrors, prisms, lenses, etc.). In one preferred embodiment of the present invention, the optical signal from the working DFB laser element (i.e., the individual laser element in the laser array which is selected by the switch) is directed to the OSR by a micro-electromechanical mirror (MEMS) directing element.

BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein like numbers refer to like parts, and further wherein:

FIG. 1 is a schematic view illustrating an optical transmitter formed in accordance with the present invention; and FIG. 2 is a schematic view illustrating a package containing the optical transmitter of FIG. 1.

DETAILED DESCRIPTION OF THE PREFERRED EMBODIMENT

Looking now FIGS. 1 and 2, there is shown a widely tunable CML transmitter 5 formed in accordance with the present invention. CML transmitter 5 comprises a high speed DFB laser array 10 comprising n different laser elements 15A, 15B, 15C, etc. DFB laser array 10 is driven through a 1×n high-speed switch 20. Each laser element 15A, 15B, 15C, etc. in the laser array 10 can be individually driven by the RF input data via simple logic control on switch 20, whereby to select which laser element 15A, 15B, 15C, etc. is active (e.g., modulated).

Each DFB laser element 15A, 15B, 15C, etc. can be thermally tuned over a narrow range of wavelengths; for example, a 4 nm tuning range is obtained on any one of the laser elements 15A, 15B, 15C, etc. by changing its respective temperature by 30-40 degrees Celsius. The center wavelength of the laser elements 15A, 15B, 15C, etc. are chosen to increase from the first to the nth element at a particular ramp rate per element (e.g., a 4 nm/element ramp rate means that the n=10th element is 4×n nm=40 nm shifted relative to the 1st element.) In order to tune the laser transmitter to a desired wavelength, $\lambda$, over a 40 nm span of the C band (1526 nm to 1566 nm), one of the laser array elements 15A, 15B, 15C, etc. whose center wavelength is closest to $\lambda$ is selected by the high speed switch element 20. The temperature of the selected laser array element 15A, 15B, 15C, etc. is then thermally adjusted, so that the output of the selected laser element 15A, 15B, 15C, etc. is tuned to the desired wavelength, $\lambda$. An example a chip incorporating such a 1×n high speed switch 20 is one made by Hittite Corporation. The number of laser array elements 15A, 15B, 15C, etc. in laser array 10, e.g., there could be 8 to 12 laser array elements 15A, 15B, 15C, etc. in laser array 10 for a 40 nm tuning range.

The optical output from the DFB laser array 10 is collimated by a first lens 25, then directed by a MEMS mirror element 30 through an optical isolator 35 and into the output OSR 40. The output of the OSR 40 is directed through a lens 45 to the output fiber 50. The OSR 40 performs the pulse re-shaping function in a manner described in the eight (8) above-identified U.S. patent applications.

A tab beam splitter 55 may be used to divert light to a quadrant photodetector 60, or a second photodetector 65.

In one alternative embodiment of the present invention, the DFB laser array may include a power combiner and a Semiconductor Optical Amplifier (SOA) or a reduced-element array of DBR lasers.

In another alternative embodiment of the present invention, two 1×m switches are used in place of 1×n switch 20, where m=n/2 such, that each 1×m switch can select ½ the number of laser array elements 15A, 15B, 15C, etc. For example, instead of using one 1×12 switch, two 1×6 switches may be used. This configuration requires two inputs to the laser transmitter, one for each 1×m switch. Typical laser drivers provide two outputs called DATA and DATA-bar, where DATA-bar carries is the logical inverse of the digital data. In this case, an inverter element is used after the DATA-bar input to the switch, in order to convert DATA-bar to have the same logic as DATA, making the two signals the same. Such an implementation allows an increase in the number of array elements and can be used to extend the wavelength tuning range of the module. For example, it is possible to use two 1×12 switches to address a 24 element DFB array which, in view of its large number of elements, may be tunable across both C and L bands.

One important feature of the present invention is that the OSR periodicity is the same as that of the center wavelengths of the laser array. For example, if the laser array elements 15A, 15B, 15C etc. are separated by 50 GHz from one element to the next, then the OSR filter will also have a 50 GHz periodicity. This ensures that when the directly modulated switch 20 is used to direct the selected output of the laser array the OSR, the wavelength of the modulated laser is near the transmission edge of the OSR, as disclosed in the eight (8) above-identified patent application. In one preferred construction, the OSR filter is placed on a separate thermoelectric cooler in order to adjust its center wavelength.

MODIFICATIONS

It will be understood that many additional changes in the details, materials, steps and arrangements of parts, which have been herein described and illustrated in order to explain the nature of the invention, may be made by those skilled in the art within the principles and scope of the invention as expressed in the appended claims.

What is claimed is:

1. An optical transmitter comprising:
   (i) an electrical switch;
   (ii) a laser array comprising a plurality of tunable laser elements; and
   (iii) an Optical Spectrum Reshaper (OSR) used to reshape the output pulses from the laser elements in the laser array;

wherein the electrical switch takes an input electrical digital signal and selectively directs it to a specific laser element in the laser array.

2. An optical transmitter according to claim 1, wherein the laser array is thermally tunable.

3. An optical transmitter according to claim 1, wherein the laser elements in the laser array are directly modulated Distributed Feedback (DFB) lasers.

4. An optical transmitter according to claim 1, wherein Optical Spectrum Reshaper (OSR) is periodic.

5. An optical transmitter according to claim 1, wherein the optical outputs of the individual laser elements in the laser array are selectively coupled to the OSR filter through a micro-electromechanical mirror (MEMS) directing element.

6. A widely tunable, dispersion tolerant transmitter comprising:

(i) an electrical switch element having an input and n outputs;

(ii) a tunable laser unit comprising an array of n laser elements;

(iii) a micro-electro-mechanical mirror; and (iv) a periodic optical spectrum reshaper;

wherein the electrical switch selectively directs an input electrical data signal to directly modulate one of the n elements of the laser array so as to produce a frequency modulated signal, and wherein the micro-electro-mechanical mirror selectively directs the output of the modulated laser element to the optical spectrum reshaper so as to generate a amplitude modulated signal.

* * * * *

UNITED STATES PATENT AND TRADEMARK OFFICE
CERTIFICATE OF CORRECTION

PATENT NO. : 7,480,464 B2 Page 1 of 1
APPLICATION NO. : 11/635861
DATED : January 20, 2009
INVENTOR(S) : McCallion et al.

It is certified that error appears in the above-identified patent and that said Letters Patent is hereby corrected as shown below:

Column 1
Line 22, change "2004now" to --2004 now--

Column 2
Line 32, change "which uses" to --use--

Column 3
Line 43, change "now" to --now to--
Line 61, change "1 st" to --1st--

Column 4
Line 23, change "such," to --, such--

Column 6
Line 14, before amplitude change "a" to --an--

Signed and Sealed this

Second Day of March, 2010

David J. Kappos
*Director of the United States Patent and Trademark Office*